US006713341B2

United States Patent
Chen et al.

(10) Patent No.: US 6,713,341 B2
(45) Date of Patent: Mar. 30, 2004

(54) METHOD OF FORMING A BOTTLE-SHAPED TRENCH IN A SEMICONDUCTOR SUBSTRATE

(75) Inventors: Yi-Nan Chen, Taipei (TW); Hsien-Wen Liu, Tainan (TW); Hsin-Chuan Tsai, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/162,156

(22) Filed: Jun. 3, 2002

(65) Prior Publication Data

US 2003/0148580 A1 Aug. 7, 2003

(30) Foreign Application Priority Data

Feb. 5, 2002 (TW) ........................................ 91101977 A

(51) Int. Cl.⁷ ........................................... H01L 21/8242
(52) U.S. Cl. ..................... 438/239; 438/427; 438/381; 438/749
(58) Field of Search ................. 438/239–249, 438/427, 381, 751, 386, 389, 390; 257/301, 302, 510

(56) References Cited

U.S. PATENT DOCUMENTS

| 4,139,401 | A | * | 2/1979 | McWilliams et al. ....... 438/791 |
| 5,112,771 | A | * | 5/1992 | Ishii et al. ................... 438/389 |
| 5,348,905 | A | | 9/1994 | Kenney |
| 6,008,103 | A | * | 12/1999 | Hoepfner ..................... 438/386 |
| 6,117,350 | A | * | 9/2000 | Yoon et al. ..................... 216/99 |
| 6,486,024 | B1 | * | 11/2002 | Tews et al. .................. 438/249 |
| 2002/0036310 | A1 | * | 3/2002 | Lutzen ........................ 257/301 |

* cited by examiner

Primary Examiner—Long Pham
Assistant Examiner—Nathan Ha
(74) Attorney, Agent, or Firm—Ladas & Parry

(57) ABSTRACT

A method of forming a bottle-shaped trench in a semiconductor substrate. The method is suitable for formation of the capacitor of DRAM. First, the semiconductor substrate is selectively etched to form a trench, wherein the trench has a top portion and a bottom portion. A nitride film is then formed on the top portion of the trench. Next, the semiconductor substrate is etched through the bottom portion of the trench by a solution of hydrogen peroxide and hydrofluoric acid as the etchant to form a bottle-shaped trench followed by removal of the nitride film.

18 Claims, 5 Drawing Sheets

METHOD OF FORMING A BOTTLE-SHAPED TRENCH IN A SEMICONDUCTOR SUBSTRATE

BACKGROUND OF THE INVENTION

1. Field of the Invention

The present invention relates to the manufacture of semiconductor device, more particularly to a method of forming a bottle-shaped trench in a semiconductor substrate for formation of the capacitor of dynamic recess random memory (DRAM).

2. Description of the Related Art

As the integration density of a dynamic random access memory (DRAM) steadily increases, it becomes necessary to reduce the memory cell size. The memory cell size is primarily determined by the minimum resolution dimension of a lithographic technique, the overlay tolerances between the different features and the layout of these features. At the same time, it is necessary to maintain the minimum required storage capacitance to reliably operate the DRAM. To meet both the cell size requirement and the storage capacitance requirement, a trench capacitor was invented; the simple single device/capacitor memory cell has been altered to provide the capacitor in a vertical dimension. In such designs, the capacitor is formed in a trench in the surface of the semiconductor substrate. For example, U.S. Pat. No. 5,348,905 issued to Kenney on Sep. 20, 1994, entitled, "METHOD OF MAKING DIFFUSED BURIED PLATE TRENCH DRAM CELL ARRAY", teaches the basic elements and process steps for fabricating a buried plate DRAM cell structure.

However, as the size of a DRAM is scaled down by a factor of f (feature size), the trench storage node capacitance decreases by a factor of f. Therefore, it is important to develop methods to increase the storage capacitance. One method employed to increase capacitance is to widen the bottom portion of the trench, thus, increasing the surface area and creating a "bottle shaped" capacitor. However, in order to space the capacitors close together, control of the etching process used to widen the bottom portion becomes a governing factor. Chemical dry etching is predominantly used in the prior art to create the bottle-shaped portion of the capacitor. In U.S. Pat. No. 5,112,771 issued to Ishii, et al. on May 12, 1992, entitled, "METHOD OF FABRICATING A SEMICONDUCTOR DEVICE HAVING A TRENCH", the bottom region of a trench capacitor is enlarged. This is accomplished by leaving a silicon oxide film on the upper sidewall of a trench, and enlarging the width of the exposed bottom portion of the trench by an isotropic dry etching process. Since the silicon substrate is isotropically dry etched, it is etched not only in the vertical direction to the surface of the substrate, but also in the horizontal direction. Although the capacitor surface area is enlarged, the etching recipes are not easily controlled.

SUMMARY OF THE INVENTION

In view of the above disadvantages, an object of the invention is to provide a method of forming a bottle-shaped trench in a semiconductor substrate. According to the method, the capacitor surface area can be efficiently enlarged in a simpler way. That is to say, the formation condition of the bottle-shaped trench for capacitor can be easily controlled.

Accordingly, the above objects of are attained by providing a method of forming a bottle-shaped trench in a semiconductor substrate. First, a hard mask having an opening is formed on the semiconductor substrate. The semiconductor substrate is then etched through the opening of the hard mask to create a trench, by for example reactive ion etching, wherein the trench has a top portion and a bottom portion. Next, an oxide film is formed on the surfaces of the trench and the hard mask. Then, a shield material is filled the bottom portion of the trench followed by removal a part of the oxide film to leave the oxide film protected by the shield material and expose the surface of the semiconductor substrate at the top portion of the trench. Next, the shield material is removed to expose the oxide film formed on the bottom portion of the trench. Afterward, a nitride film is formed on the top portion of the trench. Then, the oxide film is etched to expose the surface of the semiconductor substrate at the bottom portion of the trench. The semiconductor substrate is selectively etched through the bottom portion of the trench by a solution of hydrogen peroxide and hydrofluoric acid as the etchant to form a bottle-shaped trench followed by removal of the nitride film. According to the method of the invention, the bottle shaped trench can be easily created by wet etch through the bottom of the trench. The end point of the wet etch can be easily determined by time mode.

Furthermore, the semiconductor substrate can be single-crystalline silicon substrate. Also, the hard mask preferably comprises a pad oxide formed on the semiconductor substrate and a silicon nitride formed on the pad oxide.

The shield material can be formed by coating a photoresist material into the trench followed by partially removing the photoresist material formed at the top portion of the trench to leave the photoresist material formed at the bottom portion of the trench to serve as the shield material.

Furthermore, the oxide film is preferably silicon oxide formed by chemical vapor deposition using tetra-ethyl-ortho-silicate (TEOS) as the reactive gas. Moreover, the nitride film is preferably silicon nitride formed by reaction of the silicon substrate in a high temperature ambient (650° C.~800° C.) containing nitrogen gas ($N_2$) and ammonia gas ($NH_3$).

Furthermore, the oxide film at the top portion of the trench can be removed by buffered oxide etchant (BOE).

Furthermore, the removal of the nitride film comprises the steps of forming a sacrificial oxide on the surface of the bottled-shaped trench by high density plasma chemical vapor deposition; and removing the sacrificial oxide and the nitride film by a solution containing hydrofluoric acid and ethylene glycol.

Furthermore, the removal of oxide film and etching of the bottle shaped trench can be performed by the same etching process (using hydrogen peroxide and hydrofluoric acid).

Furthermore, the above objects of the invention can be attained by providing a method of forming a bottle-shaped trench for capacitor in a semiconductor substrate. First, the semiconductor substrate is selectively etched to form a trench, wherein the trench has a top portion and a bottom portion. A nitride film is then formed on the top portion of the trench. Next, the semiconductor substrate is etched through the bottom portion of the trench by a solution of hydrogen peroxide and hydrofluoric acid as the etchant to form a bottle-shaped trench followed by removal of the nitride film.

DETAILED DESCRIPTION OF THE PREFERRED EMBODIMENTS

The following description will explain the method of forming a bottle-shaped trench in a semiconductor substrate according to the preferred embodiments of the invention, which proceeds with reference to the accompanying drawings.

FIGS. 1 to 10 are cross-sections showing the manufacturing steps of forming a bottled-shaped trench in a semiconductor substrate according to the preferred embodiment of the invention.

Figure 1:
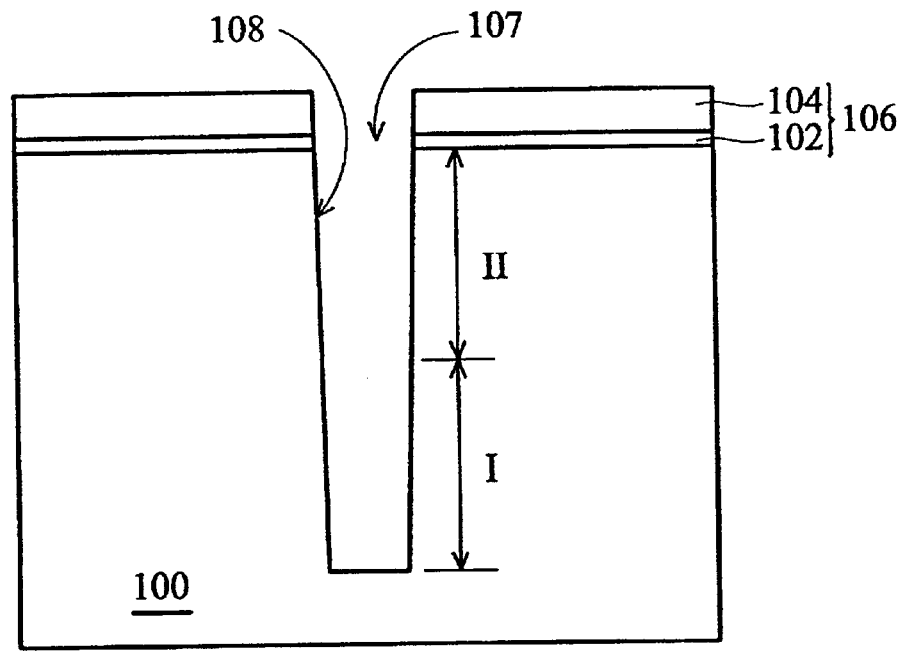
FIGS. 1 to 10 are cross-sections showing the manufacturing steps of forming a bottled-shaped trench in a semiconductor substrate according to the preferred embodiment of the invention.

As shown in FIG. 1, a semiconductor substrate 100 made of single-crystalline silicon is provided. Next, a hard mask 106 having an opening 107 is formed on the predetermined position of the semiconductor substrate 100. The hard mask 106 comprises a pad oxide 102 formed on the surface of the semiconductor substrate 100 and a silicon nitride layer 104. The semiconductor substrate 100 is anisotropically etched through the opening 107 of the hard mask 106 by reactive ion etching using hydrogen bromide (HBr), nitrogen trifluoride ($NF_3$), and oxygen gas ($O_2$) as the main reactive gas. Therefore, a straight trench 108, in the range of approximately 60000 to 80000 angstroms depth, is created. The trench 108 is divided into a bottom portion I and a top portion II.

Figure 2:
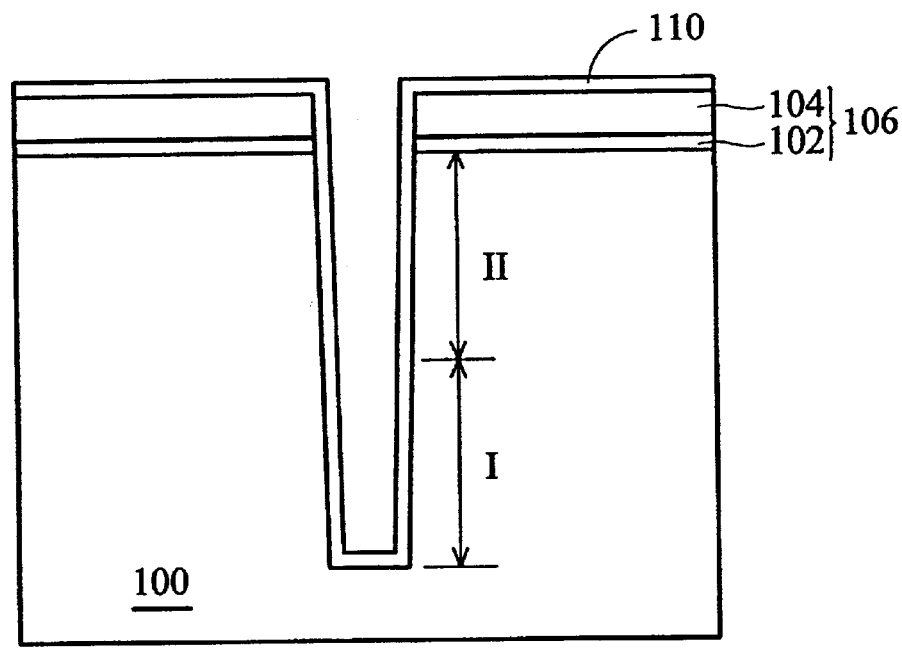

Next, as shown in FIG. 2, a silicon oxide film 110, in the range of approximately 50 to 200 angstroms thick, is formed on surface of the trench 108 and extended on the upper surface of the hard mask 106 by chemical vapor deposition (CVD) using tetra-ethyl-ortho-silicate (TEOS) as the reactive gas. Alternately, the silicon oxide film 110 can be grown by thermal oxidation.

Figure 3:
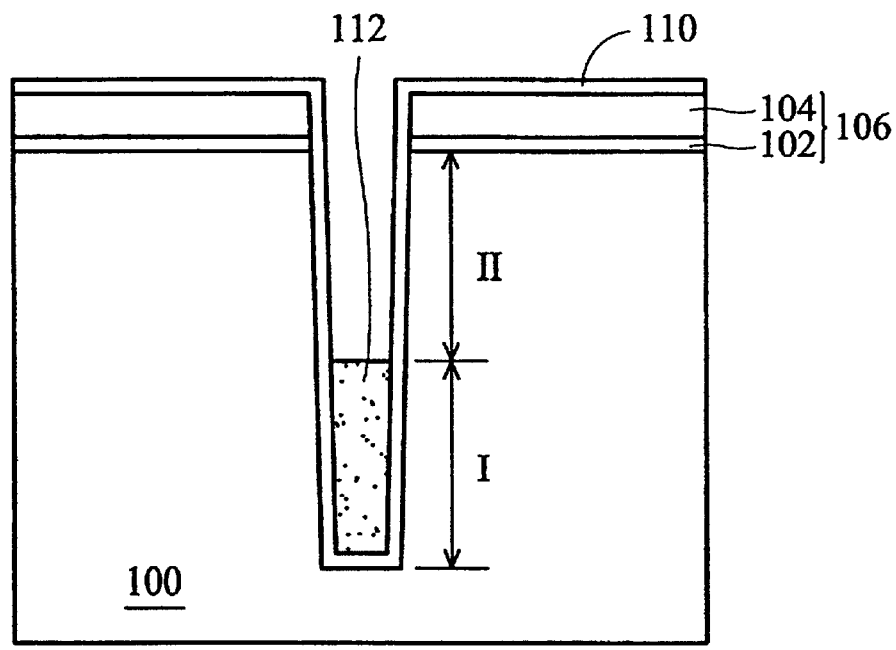

Afterward, referring to FIG. 3, a photoresist material is coated to fill the trench 108 by spin coating. The photoresist material formed at the top portion II is then etched so that a photoresist feature formed at the bottom portion I, serving as the shield material 112, is left. Also, the surface of silicon oxide film 110 at the top portion II is exposed.

Figure 4:
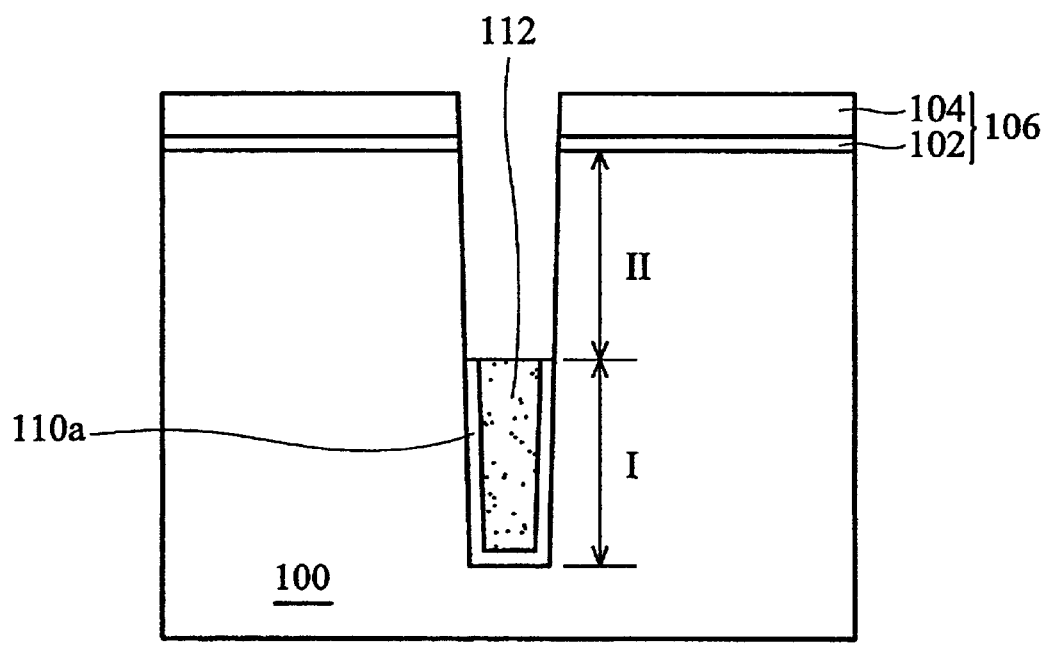
Figure 5:
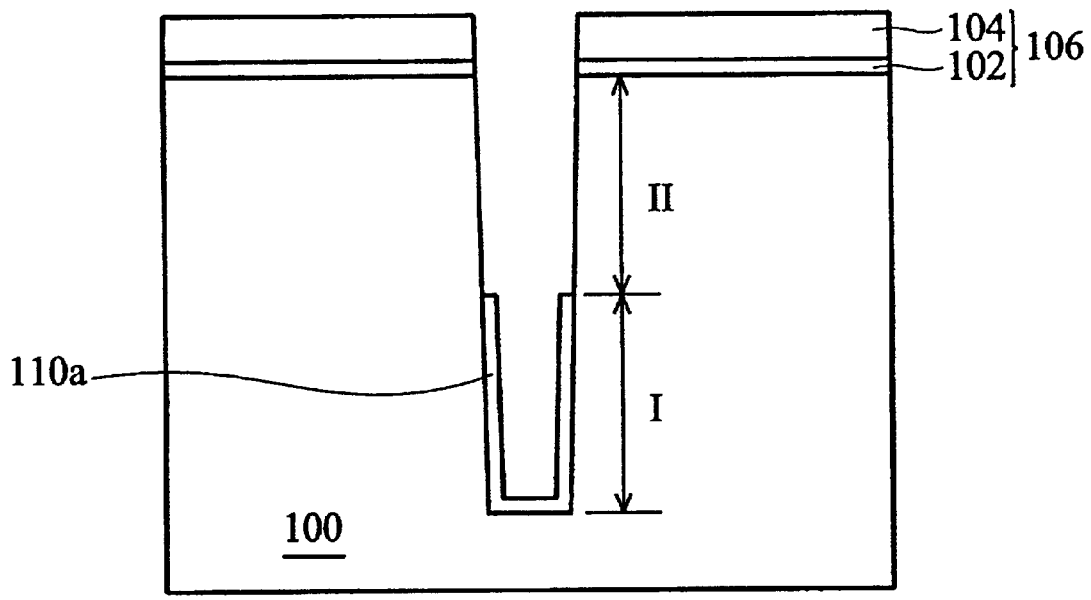

Then, as shown in FIG. 4, the exposed silicon oxide film 110 is wet etched by diluted hydrofluoric acid or buffered oxide etchant (BOE) to leave a silicon oxide film 110a protected by the shield material 112 and expose the surface of the semiconductor substrate 100 at the top portion II. As shown in FIG. 5, the shield material 112 is completely removed.

Figure 6:
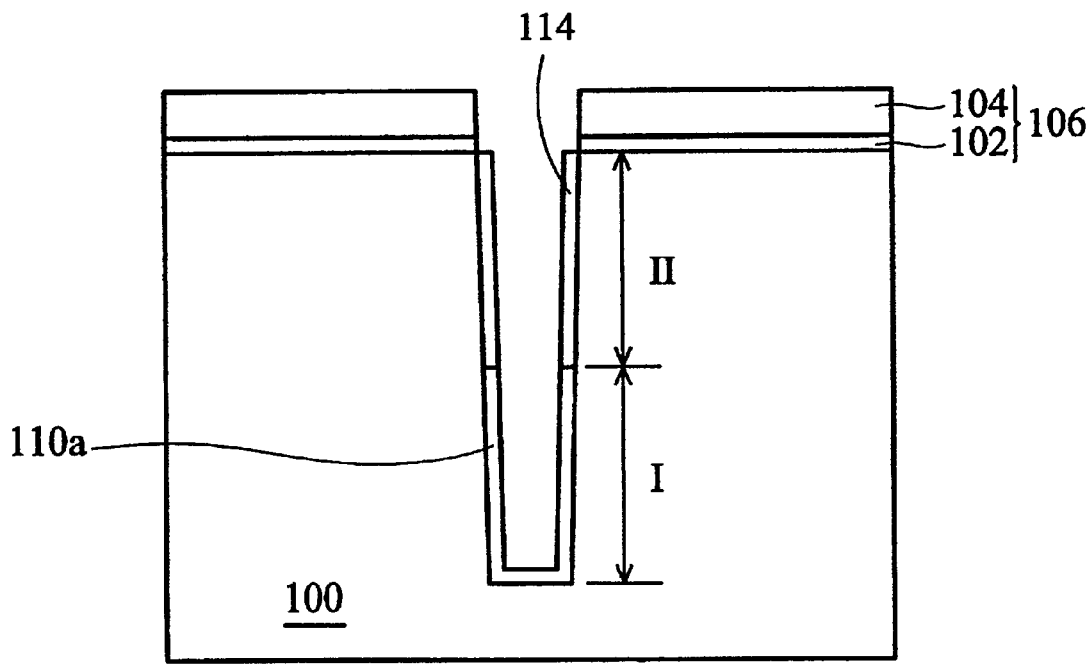

Referring to FIG. 6, a silicon nitride film 114, in the range of approximately 50 to 200 angstroms thick, is formed by reaction of exposed semiconductor substrate 100 at the top portion II in a high temperature ambient containing nitrogen gas and ammonia gas. That is to say, the silicon nitride film 114 is formed by rapid thermal nitration (RTN). Also, the reactive temperature of RTN is about 650° C. to 800° C.

Figure 7:
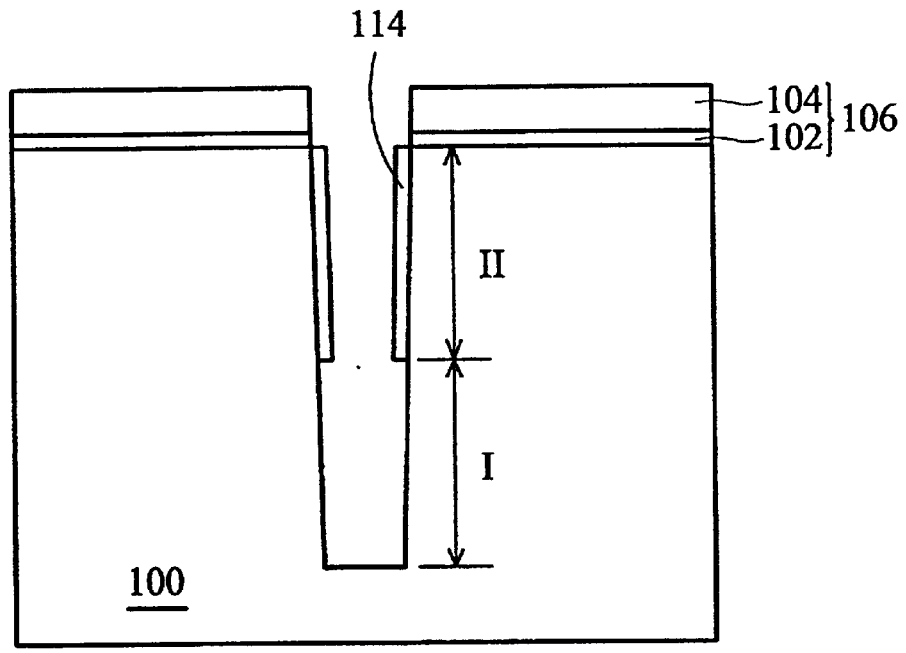
Figure 8:
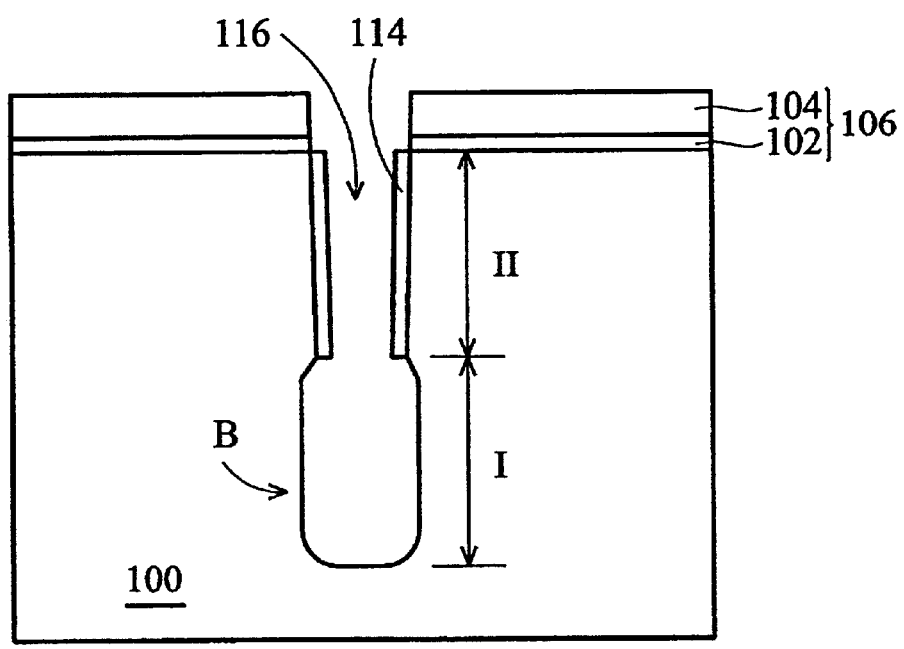
Figure 9:
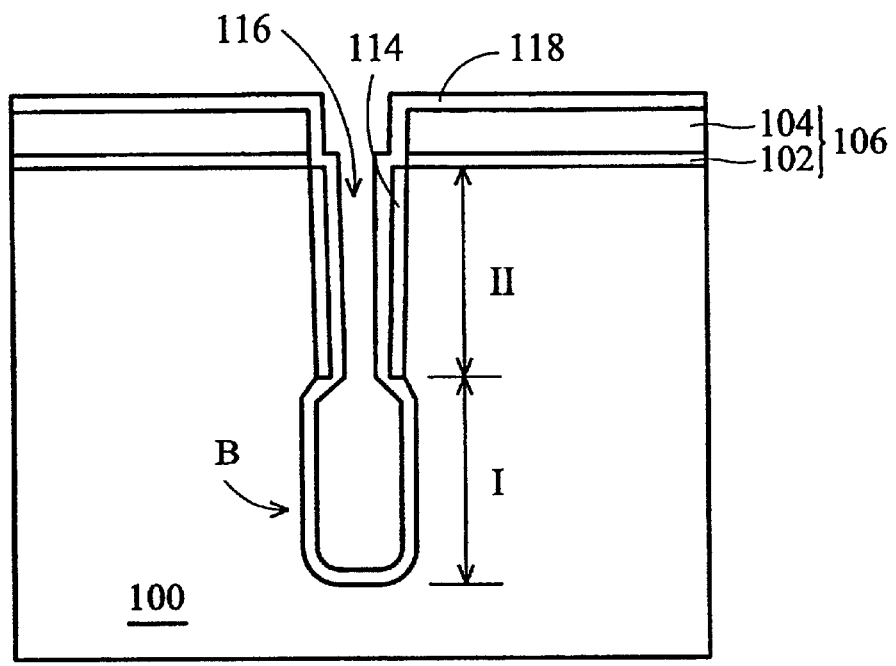
Figure 10:
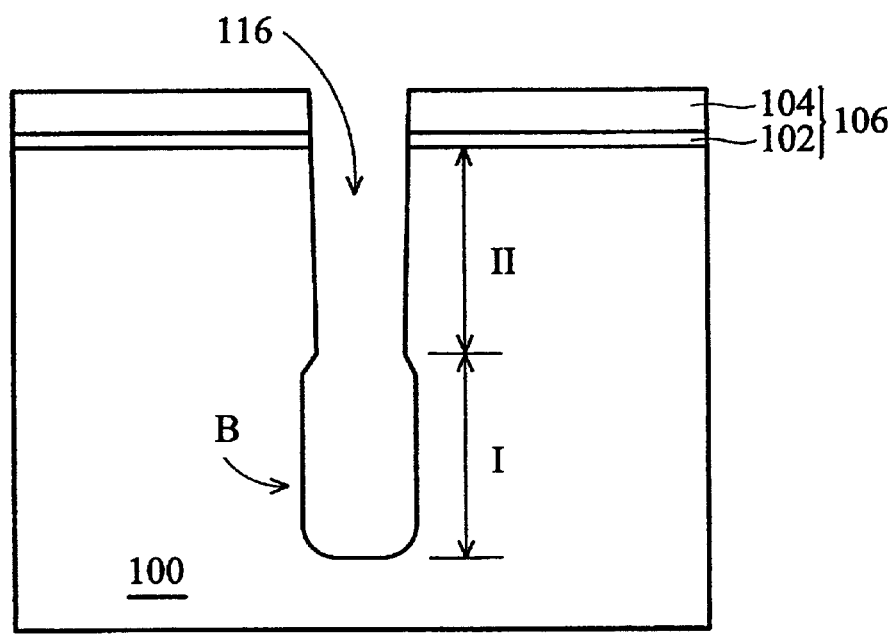

As shown in FIGS. 7 and 8, the silicon oxide film 110a and semiconductor substrate 100 are etched through the bottom portion I of the trench 108 to form a bottle-shaped trench 116 having an enlarged portion B. This etching process is carried out by a solution containing hydrogen peroxide ($H_2O_2$) and hydrofluoric acid (HF). Moreover, the ratio of hydrogen peroxide: hydrofluoric acid in this solution is preferably 10:1~40:1.

Next, a sacrificial silicon oxide 118 is globally deposited on the silicon nitride film 114 and extended on the silicon nitride 104 of the hard mask 106 by high density plasma chemical vapor deposition (HDPCVD). A etchant containing hydrofluoric acid and ethylene glycol is used to remove the sacrificial silicon oxide 118 and silicon nitride film 114 formed in the bottle-shaped trench 116.

While the invention has been described with reference to various illustrative embodiments, the description is not intended to be construed in a limiting sense. Various modifications of the illustrative embodiments, as well as other embodiments of the invention, will be apparent to those skilled in the art upon reference to this description. It is therefore contemplated that the appended claims will cover any such modifications or embodiments as may fall within the scope of the invention defined by the following claims and their equivalents.

What is claimed is:

1. A method of forming the bottle-shaped trench in a semiconductor substrate, suitable for formation of the capacitor of DRAM, comprising the steps of:
    (a) forming a hard mask having an opening on the semiconductor substrate;
    (b) etching the semiconductor substrate through the opening of the hard mask to create a trench, wherein the trench has a top portion and a bottom portion;
    (c) forming an oxide film on the surfaces of the trench and the hard mask;
    (d) filling a shield material in the bottom portion of the trench;
    (e) removing a part of the oxide film to leave the oxide film protected by the shield material and expose the surface of the semiconductor substrate at the top portion of the trench;
    (f) removing the shield material to expose the oxide film formed on the bottom portion of the trench;
    (g) forming a nitride film on the top portion of the trench;
    (h) removing the oxide film to expose the surface of the semiconductor substrate at the bottom portion of the trench;
    (i) etching the semiconductor substrate through the bottom portion of the trench by a solution of hydrogen peroxide and hydrofluoric acid as the etchant to form the bottle-shaped trench; and
    (j) removing the nitride film.

2. The method of forming a bottle-shaped trench in a semiconductor substrate as claimed in claim 1, wherein the semiconductor substrate is silicon substrate.

3. The method of forming a bottle-shaped trench in a semiconductor substrate as claimed in claim 1, wherein the hard mask comprises a pad oxide formed on the semiconductor substrate and a silicon nitride formed on the pad oxide.

4. The method of forming a bottle-shaped trench in a semiconductor substrate as claimed in claim 1, wherein step (b) is performed by anisotropic reactive ion etching (RIE).

5. The method of forming a bottle-shaped trench in a semiconductor substrate as claimed in claim 1, wherein the oxide film is silicon oxide formed by chemical vapor deposition using tetra-ethyl-ortho-silicate (TEOS) as the reactive gas.

6. The method of forming a bottle-shaped trench in a semiconductor substrate as claimed in claim 1, wherein step (d) further comprises the steps of:
    coating a photoresist material into the trench; and
    partially removing the photoresist material formed at the top portion of the trench to leave the photoresist material formed at the bottom portion of the trench to serve as the shield material.

7. The method of forming a bottle-shaped trench in a semiconductor substrate as claimed in claim 1, wherein step (e) is performed by buffered oxide etchant (BOE).

8. The method of forming a bottle-shaped trench in a semiconductor substrate as claimed in claim 2, wherein the nitride film is silicon nitride formed by reaction of the semiconductor substrate in a high temperature ambient containing nitrogen gas and ammonia gas.

9. The method of forming a bottle-shaped trench in a semiconductor substrate as claimed in claim 1, wherein step (j) further comprises the steps of:

forming a sacrificial oxide on the surface of the bottled-shaped trench by high density plasma chemical vapor deposition; and removing the sacrificial oxide and the nitride film by a solution containing hydrofluoric acid and ethylene glycol.

10. The method of forming a bottle-shaped trench in a semiconductor substrate as claimed in claim 1, wherein steps (i) and (h) are performed by the same etching process.

11. A method of forming a bottle-shaped trench in a semiconductor substrate, suitable for formation of the capacitor of DRAM, comprising the steps of:

selectively etching the semiconductor substrate to form a trench, wherein the trench has a top portion and a bottom portion;

forming a nitride film on the top portion of the trench;

etching the semiconductor substrate through the bottom portion of the trench by a solution of hydrogen peroxide and hydrofluoric acid as the etchant to form the bottle-shaped trench;

forming a sacrificial oxide on the surface of the bottle-shaped trench by high density plasma chemical vapor deposition; and removing the sacrificial oxide and the nitride film by a solution containing hydrofluoric acid and ethylene glycol.

12. The method of forming a bottle-shaped trench in a semiconductor substrate as claimed in claim 11, wherein the semiconductor substrate is silicon substrate.

13. The method of forming a bottle-shaped trench in a semiconductor substrate as claimed in claim 12, wherein the nitride film is silicon nitride formed by reaction of the semiconductor substrate in a high temperature ambient containing nitrogen gas and ammonia gas.

14. A method of forming a bottle-shaped trench in a semiconductor substrate, suitable for formation of the capacitor of DRAM, comprising the steps of:

providing a trench having a top portion and a bottom portion in the semiconductor substrate;

forming an oxide film on the surfaces of the trench;

filling a shield material in the bottom portion of the trench;

removing a part of the oxide film to leave the oxide film protected by the shield material and expose the surface of the semiconductor substrate at the top portion of the trench;

removing the shield material to expose the oxide film formed on the bottom portion of the trench;

forming a nitride film on the top portion of the trench;

removing the oxide film to expose the surface of the semiconductor substrate at the bottom portion of the trench; and etching the semiconductor substrate through the bottom portion of the trench using a wet etchant to form the bottle-shaped trench.

15. The method of claim 14, further comprising the steps of:

forming sacrificial oxide on the surface of the bottle-shaped trench by high density plasma chemical vapor deposition; and removing the sacrificial oxide and the nitride film by a solution containing hydrofluoric acid and ethylene glycol.

16. The method of claim 14, wherein the wet echant comprises a solution of hydrogen peroxide and hydrofluoric acid.

17. The method of claim 14, wherein the semiconductor substrate is silicon substrate.

18. The method of claim 14, wherein the nitride film is silicon nitride formed by reaction of the semiconductor substrate in a high temperature ambient containing nitrogen gas and ammonia gas.

* * * * *